United States Patent [19]

Wrathall

[11] 4,380,706

[45] Apr. 19, 1983

[54] VOLTAGE REFERENCE CIRCUIT

[75] Inventor: Robert S. Wrathall, Tempe, Ariz.

[73] Assignee: Motorola, Inc., Schaumburg, Ill.

[21] Appl. No.: 219,797

[22] Filed: Dec. 24, 1980

[51] Int. Cl.[3] .......................... H03K 3/26; H03K 3/01

[52] U.S. Cl. .................................... 307/297; 307/310; 307/315; 323/313

[58] Field of Search ........................ 307/297, 310, 315; 323/313, 314

[56] References Cited

U.S. PATENT DOCUMENTS

| | | | |
|---|---|---|---|
| 3,286,200 | 11/1966 | Foulger | 307/315 |
| 4,071,813 | 1/1978 | Dobkin | 323/313 |
| 4,176,308 | 11/1970 | Dobkin et al. | 323/314 |
| 4,287,439 | 9/1981 | Leuschner | 323/314 |

*Primary Examiner*—Stanley D. Miller
*Assistant Examiner*—B. P. Davis
*Attorney, Agent, or Firm*—Joe E. Barbee

[57] ABSTRACT

A voltage reference source is provided which is temperature stable and can be made by standard CMOS processes. The voltage reference can provide an output voltage which is equal to twice the bandgap voltage. The voltage reference circuit uses a differential amplifier which has an output coupled to an additional amplifying stage. Two substrate bipolar transistors are used wherein the emitter current density of one of the transistors is larger than the emitter current density of the other transistor. An additional transistor is inserted between the output of the amplifying stage and the substrate bipolar transistors thereby providing the output voltage of twice the bandgap voltage.

6 Claims, 1 Drawing Figure

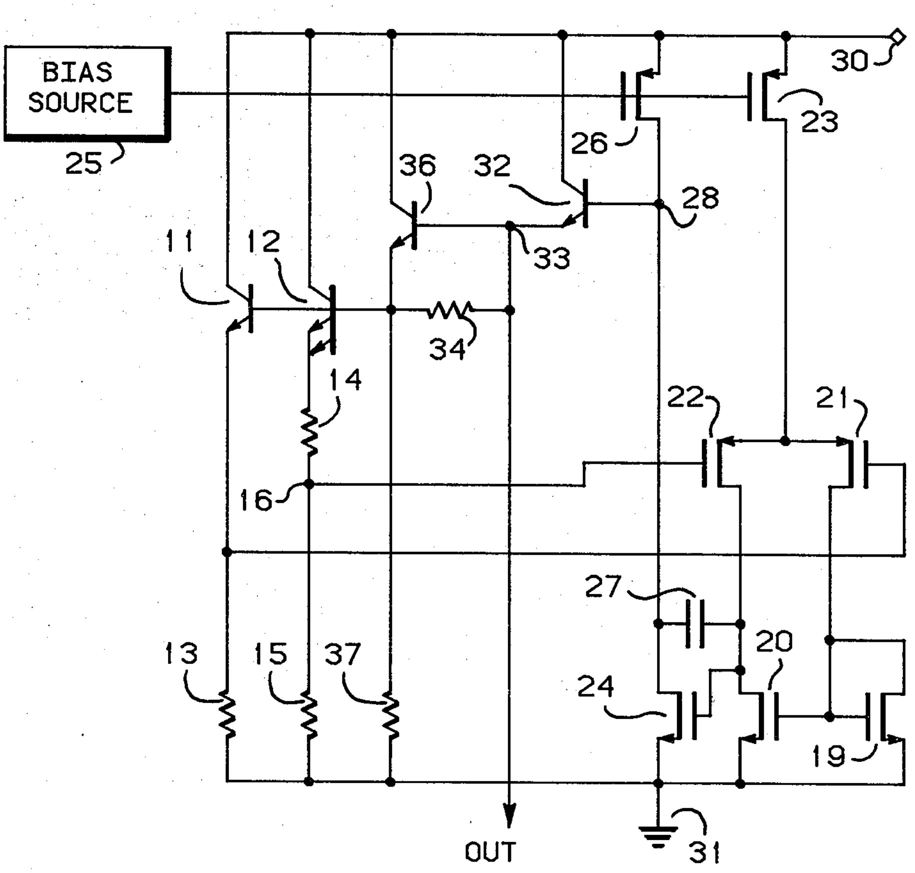
BIAS SOURCE
25
30
26
23
36
32
28
33
11
12
34
14
22
21
16
27
20
13
15
37
24
19
OUT
31

VOLTAGE REFERENCE CIRCUIT

This invention relates, in general, to a voltage reference circuit, and more particularly, to a voltage reference circuit which can provide an output voltage which is referenced to the bandgap voltage.

It has been shown that a diode forward voltage is nearly a linear function of the absolute temperature, and that the temperature coefficient of the diode forward voltage can be cancelled in a fairly wide temperature range by the temperature coefficient of the diode forward voltage differential. Basically, R. J. Widlar has shown that if the sum of a diode forward voltage drop plus a diode drop differential equals the energy gap of silicon, this sum value is almost temperature stable. All that is required to make a temperature stable reference voltage is to generate a $V_{BE}$ and add to this value a $\Delta V_{BE}$ of such value that the voltage of the series combination equals the bandgap energy of 1.205 volts.

In the past, the bandgap reference has been considered the best reference for a good reproducible temperature stable reference below 3 volts. A pending patent application filed for Horst Leuschner, Ser. No. 034,513, filed Apr. 30, 1979 and now U.S. Pat. No. 4,287,439 issued Sept. 1, 1981, presents an invention which takes advantage of the fact that a standard CMOS process can be used to build substrate bipolar transistors (emitter followers with a collector being the substrate) thereby providing a CMOS bandgap reference circuit.

The present invention takes advantage of this prior CMOS bandgap circuit and provides an output reference voltage which is higher than the bandgap voltage thereby making the voltage reference circuit less process sensitive.

Another object of the present invention is adding an additional forward diode voltage or $V_{BE}$ drop to a bandgap reference circuit and obtaining a substantially temperature stable output voltage which is higher than the bandgap voltage.

SUMMARY OF THE INVENTION

In carrying out the above and other objects and advantages of the present invention, there is provided, in one form, a voltage reference circuit having a differential amplifier and a first and a second bipolar transistor wherein the emitter of the first transistor is larger than the emitter of the second transistor. Two cascaded emitter followers are connected between the output of the differential amplifier and the bases of the first and second transistors. By using two cascaded emitter followers, the output voltage produced by the voltage reference circuit is higher than the bandgap voltage. This higher voltage gets coupled from the first and second transistors back to the inputs of the differential amplifier. Since this voltage is higher it helps establish more positive operation of the voltage reference circuit so that the voltage reference circuit is less process dependent or sensitive.

The subject matter which is regarded as the invention is set forth in the appended claims. The invention itself, however, together with further objects and advantages thereof, may be understood by referring to the following detailed description taken in conjunction with the accompanying drawing.

BRIEF DESCRIPTION OF THE DRAWING

The single FIGURE illustrates in schematic form an embodiment of the present invention.

DETAILED DESCRIPTION OF THE DRAWING

It is well-known that a standard CMOS process can be used to build substrate bipolar transistors. These bipolar substrate transistors are typically used as emitter followers since the collector is formed by the substrate. The single FIGURE shows four such substrate bipolar transistors 11, 12, 36, and 32. Transistor 11 is illustrated as having its collector connected to voltage terminal 30 and its emitter coupled to voltage terminal 31 through a resistor 13. Transistor 12 is illustrated as having double emitters to indicate that its emitter area is larger than the emitter area of transistor 11. Transistor 12 has its collector connected to voltage terminal 30 while its emitters are connected to one end of a resistor 14. Resistor 14 has its other end connected to a node 16. Node 16 is coupled to voltage terminal 31, which is illustrated as ground, through a resistor 15. Transistor 36 has its collector connected to voltage terminal 30 and has its emitter connected to the bases of transistors 11 and 12. The emitter of transistor 36 is also coupled to voltage terminal 31 through resistor 37. Resistor 37 is chosen such as to maintain the current density of transistor 36 the same as the current density of transistor 11. Transistor 32 has its collector connected to voltage terminal 30 and has its emitter connected to the base of transistor 36. The emitter of transistor 32 and the base of transistor 36 form a node 33. Node 33 serves as the output node for the voltage reference circuit. A resistor 34 is coupled between node 33 and the emitter of transistor 36. The purpose of resistor 34 is to act as a bleed resistor for transistor 32 so that the current carried by transistor 32 will be larger than the thermal currents produced by the transistor so that the thermal currents do not become the controlling currents in transistor 32.

The voltage reference circuit illustrated in the single FIGURE also has a differential amplifier which is illustrated as a CMOS differential amplifier having transistors 19 through 23. N-channel transistors 19 and 20 are connected in a current mirror configuration and serve as the load transistors for P-channel switching transistors 21 and 22. Transistors 19 and 20 have their sources connected to voltage terminal 31 and have their gate electrodes connected to the drain electrode of transistor 19. The drain electrode of transistor 19 is also connected to the drain electrode of transistor 21. The drain electrode of transistor 20 is connected to the drain electrode of transistor 22. Transistors 21 and 22 have their source electrodes connected together to the drain electrode of P-channel transistor 23. P-channel transistor 23, which serves as a current source for the differential amplifier, has its source electrode connected to voltage terminal 30. The gate electrodes of transistors 21 and 22 serve as the inputs for the differential amplifier. The gate electrode of transistor 23 is connected to a bias source 25 which can be referenced to a current source. P-channel transistor 26 is connected in series with N-channel transistor 24 between voltage terminals 30 and 31 to form an amplifier for amplifying the output of the differential amplifier. The output of the differential amplifier is connected to the gate electrode of transistor 24. A frequency compensating capacitor 27 is connected from the drain electrode of transistor 24 to the drain electrode of transistor 20. The output of the amplifier formed by transistors 24 and 26 appears at node 28 which is coupled to the base electrode of transistor 32. The gate electrode of transistor 26 is connected to bias source 25.

The gain of the differential amplifier, at a proper current biasing, is in the neighborhood of 60 db. The addition of the gain stage formed by transistors 24 and 26 boosts the overall effective gain of the differential amplifier by roughly a factor of 10. With this type of gain attributed to the differential amplifier, and the closed negative feedback, both inputs to the differential amplifier are at the same voltage potential in a non-transient condition. This means that the voltage across resistors 13 and 15 are equal and therefore the ratio of currents through resistors 13 and 15 is equal to the inverse of the resistor ratio. In the embodiment illustrated, emitter follower transistor 12 consists of a plurality of parallel transistors each equal to emitter follower transistor 11. If it is assumed that the effective emitter area of transistor 12 is twice as large as the emitter area of transistor 11 then transistor 12 can conduct twice as much current as can transistor 11. If resistor 13 is selected such that the emitter current to transistor 11 is five times more than the current through resistor 15 (which is also the current to the emitter of transistor 12) then the specific current density of transistor 11 will be ten times more than the current density of transistor 12. Thus the base-emitter voltage, $V_{BE11}$, of transistor 11 is:

$$V_{BE11} = V_{BE12} + (kT/q)\ln 10$$

From this equation we can see that the voltge drop, $V_{R14}$, across resistor 14 is given by:

$$V_{R14} = (kT/q)\ln 10$$

This voltage is multiplied across resistor 15 by the ratio of resistor 15/resistor 14 to cancel the negative coefficient of the two $V_{BE}$ diode drops in the emitters of transistors 11 and 36. Therefore, the base of transistor 36 is held at two bandgap voltage levels, 2 $V_{GO}$. Using this technique the voltage drop across resistor 13 can be allowed to increase significantly from the single bandgap voltage levels case. This allows the differential amplifier to operate at an easier common mode point. This also generates a stable voltage, 2 $V_{GO}$, at node 33. In many MOS circuits such as circuits that would be coupled to the voltage reference circuit, it is preferable to have the higher reference voltage to insure that the reference voltage will overcome the threshold voltage of the transistor being driven by the output voltage of the reference circuit.

When the output voltage at node 33 is equal to twice the bandgap voltage, the voltage will measure approximately 2.41 volts. Therefore, the voltage appearing at the emitter of transistor 36 will be one diode drop ($V_{BE}$) less which results in a voltage of approximately 1.8 volts at the emitter of transistor 36. The voltage at the emitter of transistor 11 will then be an additional diode drop less which means the voltage appearing at the emitter of transistor 11 will be approximately 1.2 volts. Since the gain of the differential amplifier is sufficiently high, the voltage at the emitter of transistor 11 will be reflected to node 16 in a non-transient condition. This voltge will be high enough to properly control the operation of transistors 21 and 22 even considering slight variations of the threshold voltages due to process variations. If transistor 36 were omitted from the circuit, then the output voltage appearing at node 33 would be equal to one bandgap voltage which is approximately 1.205 volts. Since this would be the voltage appearing at the base electrode of transistor 11 the voltage at its emitter would be approximately 0.6 of a volt. With this low of a voltage (0.6) applied to the gate electrodes of transistors 21 and 22 the process followed in making these transistors would have to be closely monitored in order to ensure that process variations would not be detrimental to the operation of the transistors at such a low voltage available to overcome their threshold voltages.

By now it should be appreciated that the present invention provides a voltage reference circuit which is substantially temperature stable and provides an output voltage which is equal to twice the bandgap voltage.

By way of example only, the following resistor values were used in a circuit in which the emitter area of transistor 12 was twice as large as the emitter area of transistor 11 and produce an output voltage of twice the bandgap voltage.

| Resistors | Ohms |
|---|---|
| 13 | 1.8K |
| 14 | 475 |
| 15 | 9K |
| 34 | 15K |
| 37 | 3K |

I claim:

1. A voltage reference circuit having a differential amplifier with a first and a second input and an output, the voltage reference circuit comprising: a first transistor having a base coupled to the output of the differential amplifier and having a first electrode coupled to a first power terminal and having a second electrode; a second transistor having a base coupled to the second electrode of the first transistor, the second transistor also having a first electrode coupled to the first power terminal and having a second electrode; a first resistor coupled between the second electrode of the second transistor and a second power terminal; a third transistor having a base coupled to the second electrode of the second transistor and having a first electrode coupled to the first power terminal and having a second electrode; a second and a third resistor coupled in series between the second electrode of the third transistor and the second power terminal and forming a node between the second and third resistor, the node being coupled to the first input of the differential amplifier; a fourth transistor having a base coupled to the base of the third transistor and having a first electrode coupled to the first power terminal and having a second electrode; and a fourth resistor coupled between the second electrode of the fourth transistor and the second power terminal, and the second electrode of the fourth transistor also being coupled to the second input of the differential amplifier.

2. The voltage reference circuit of claim 1 wherein the second electrode of the third transistor and the second electrode of the fourth transistor are ratioed so that the third transistor can carry a predetermined amount of current more than the fourth transistor.

3. The voltage reference circuit of claim 2 wherein the total resistance of the second and third resistors is ratioed with the fourth resistor to establish a predetermined current density in fourth transistor.

4. The voltge reference circuit of claim 1 further including a fifth resistor coupled between the second electrode of the second transistor and the second electrode of the first transistor.

5. The voltage reference circuit of claim 1 further having an amplifier coupled between the output of the differential amplifier and the base of the first transistor.

6. The voltage reference circuit of claim 5 wherein the amplifier and the differential amplifiers are both CMOS amplifiers.

* * * * *